United States Patent
Martin et al.

(10) Patent No.: US 7,487,075 B2
(45) Date of Patent: Feb. 3, 2009

(54) SYSTEM AND METHOD TO SIMULATE A PLURALITY OF NETWORKED PROGRAMMABLE LOGIC CONTROLLERS

(75) Inventors: David E. Martin, Jonesborough, TN (US); C. Eric Gibson, Johnson City, TN (US); Scott Phillips, Jonesborough, TN (US); Harry A. Brian, Jr., Johnson City, TN (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 442 days.

(21) Appl. No.: 11/359,207

(22) Filed: Feb. 22, 2006

(65) Prior Publication Data

US 2006/0218263 A1   Sep. 28, 2006

Related U.S. Application Data

(60) Provisional application No. 60/656,592, filed on Feb. 25, 2005.

(51) Int. Cl.
*G06G 7/62* (2006.01)
*G06F 9/455* (2006.01)

(52) U.S. Cl. .......................................... 703/13; 703/23
(58) Field of Classification Search .................... 703/13, 703/23–28
See application file for complete search history.

(56) References Cited

U.S. PATENT DOCUMENTS

| | | | | |
|---|---|---|---|---|
| 6,643,555 | B1 * | 11/2003 | Eller et al. | 700/83 |
| 7,225,037 | B2 * | 5/2007 | Shani | 700/18 |
| 2004/0128002 | A1 * | 7/2004 | Frampton et al. | 700/31 |

FOREIGN PATENT DOCUMENTS

JP        2001209407        8/2001

OTHER PUBLICATIONS

PCT International Search Report mailed Jul. 4, 2006.
PCT Written Opinion of the International Searching Authority.

* cited by examiner

*Primary Examiner*—Paul L Rodriguez
*Assistant Examiner*—Juan C Ochoa

(57) ABSTRACT

A system and method for simulating a plurality of networked program logic controllers includes, in one aspect of the invention, determining if a configuration of networked program logic controllers exists; populating a configuration by creating a plurality of program logic controllers in a network if the configuration does not exist, the populating of the program logic controllers provided by use of a network view for collecting network information; and interacting with at least one of the program logic controllers to simulate a networked program logic controller.

22 Claims, 9 Drawing Sheets

SYSTEM AND METHOD TO SIMULATE A PLURALITY OF NETWORKED PROGRAMMABLE LOGIC CONTROLLERS

CROSS-REFERENCE TO RELATED APPLICATIONS

This application claims benefit of U.S. Provisional Patent Application, Ser. No. 60/656,592, filed Feb. 25, 2005.

BACKGROUND OF THE INVENTION

Conventional PLC software simulators do not currently support multiple PLCs in a network. Thus, a need exists in the industry for software to simulate entire PLC networks (1 or more PLCs) to test an application before installing it on a real network. This simulation should be able to provide a mechanism for monitoring communication as well as providing a mechanism for generating a variety of network related failures. Human-Machine Interface (HMI) applications should be able to connect to the simulated network for communication testing purposes.

BRIEF SUMMARY OF THE DISCLOSURE

The present invention enables a user to simulate entire systems that can include a plurality of program logic controllers (PLC). It will provide a mechanism for monitoring and testing communication between nodes (PLC, HMI and the like) on a system and will provide the ability to generate network related failures. It should also simulate various types of connections including, but not limited to, PROFIBUS (PROcess Field BUS)-type serial fieldbus protocol, Ethernet, Multi-Processor Interconnect (MPI), or other proprietary network connections.

More specifically, according to one aspect of the invention, a method for simulating a plurality of networked program logic controllers includes determining if a configuration of networked program logic controllers exists in a network; populating a configuration by creating a plurality of program logic controllers in the network if the configuration does not exist, the populating of program logic controllers provided by use of a network view for collecting network information; and interacting with at least one of the program logic controllers to simulate at least one networked program logic controller.

According to the method in this aspect of the invention, the network information is selected from the number of the program logic controllers, types of the program logic controllers, I/O connected to the program logic controllers, type of connection for each of the program logic controllers or various combinations of this information.

The network information in this aspect can also be at least one node associated with the networked program logic controller, and the method can include deleting the selected node from the network. The method can further include updating and displaying the configuration without the selected node.

Also according-to the method in this aspect of the invention, the network information can define at least one node and further include modifying the node. The method can further include updating and displaying the configuration with the modified node.

Further, according to the method in this aspect of the invention, each of the networked program logic controllers has a respective program logic controller view, and the method can further include opening at least two of the networked program logic controller views for interaction of at least two of the networked program logic controllers. The method can also include returning an error message to the networked program logic controller to correct an improper response by the networked program logic controller.

Also in this aspect of the invention, the method can further include assessing a number of program logic controllers in the network, determining a network cycle time and allotting respective processing times to each of the program logic controllers in the network based on the network cycle time. The method can also include adding a delay time to at least one of the processing times.

According to another aspect of the invention, a method for simulating a plurality of networked program logic controllers includes determining if a configuration of networked program logic controllers exists in a network; populating a configuration by creating a plurality of program logic controllers in the network if the configuration does not exist, the populating of program logic controllers provided by use of a wizard in a network view for entry by a user of network information; and interacting with at least one of the program logic controllers to simulate a networked program logic controller.

According to the method in this aspect of the invention, the network information includes the number of the program logic controllers, types of the program logic controllers, I/O connected to the program logic controllers, type of connection for each of the program logic controllers and various combinations of this information.

The network information in this aspect of the invention can also include at least one node associated with the networked program logic controller. The method can further include deleting the selected node from the network. Also, the method can include updating and displaying the configuration without the selected node.

Also in this aspect, the network information can define at least one node, and the method can further include modifying the node. The method can also include updating and displaying the configuration with the modified node.

Further, in this aspect of the invention, each of the networked program logic controllers has a respective program logic controller view, and the method can include opening at least two of the networked program logic controller views for interaction of at least two of the networked program logic controllers. The method can also include assessing a number of program logic controllers in the network, determining a network cycle time and allotting respective processing times to each of the program logic controllers in the network based on the network cycle time.

According to a further aspect of the invention, a method for simulating a plurality of networked program logic controllers includes determining if a configuration of networked program logic controllers exists in a network; populating a configuration by creating a plurality of program logic controllers in the network if the configuration does not exist, the populating of program logic controllers provided by use of means for collecting network information; and interacting with at least one of the program logic controllers to simulate at least one networked program logic controller. The means for collecting in this aspect of the invention can be a network view or a wizard in a network view.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE INVENTION

Figure 1:
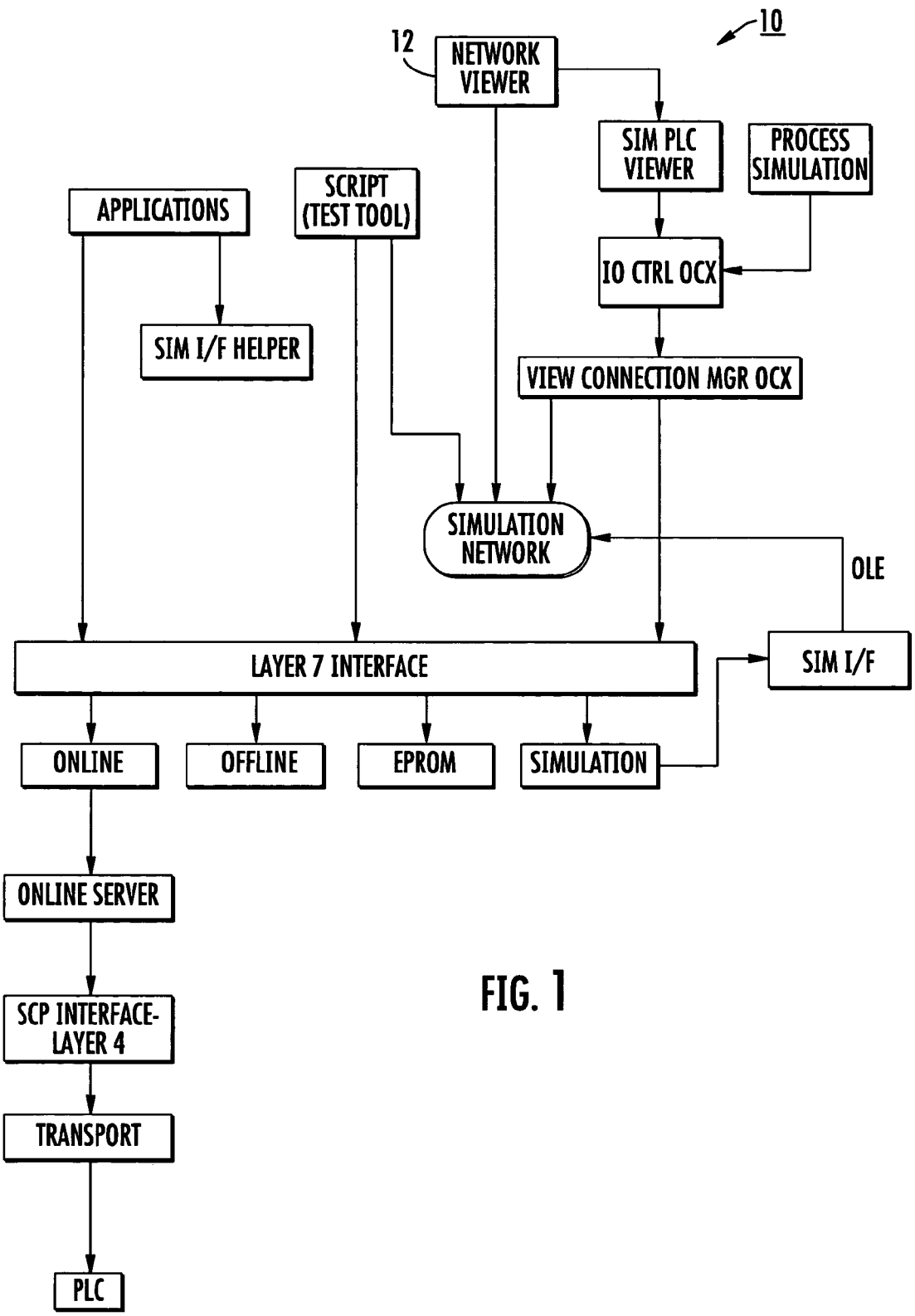
FIG. 1 is an architectural overview of a multiple PLC simulation according to an aspect of the present invention.

Detailed reference will now be made to the drawings in which examples embodying the present invention are shown. The detailed description uses numerical and lettered designations to refer to features of the drawings. Like or similar designations in the drawings and description have been used to refer to like or similar parts of the invention.

The drawings and detailed description provide a full and detailed written description of the invention and the manner and process of making and using it, so as to one skilled in the pertinent art to make and use it. The drawings and detailed description also provide the best mode of carrying out the invention. However, the examples set forth in the drawings and detailed description are provided by way of explanation of the invention only and are not meant as limitations of the invention. The present invention thus includes any modifications and variations of the following examples as come within the scope of the appended claims and their equivalents.

As broadly embodied in the figures, a user will download a simulation system from a PLC programming tool for simulating one or more PLCs and for monitoring and testing communication between the PLCs simulated in the system. As will be described in detail below, the system will also provide an ability to generate network related failures to assess a variety of effects on and responses by the simulated PLCs.

Figure 2:
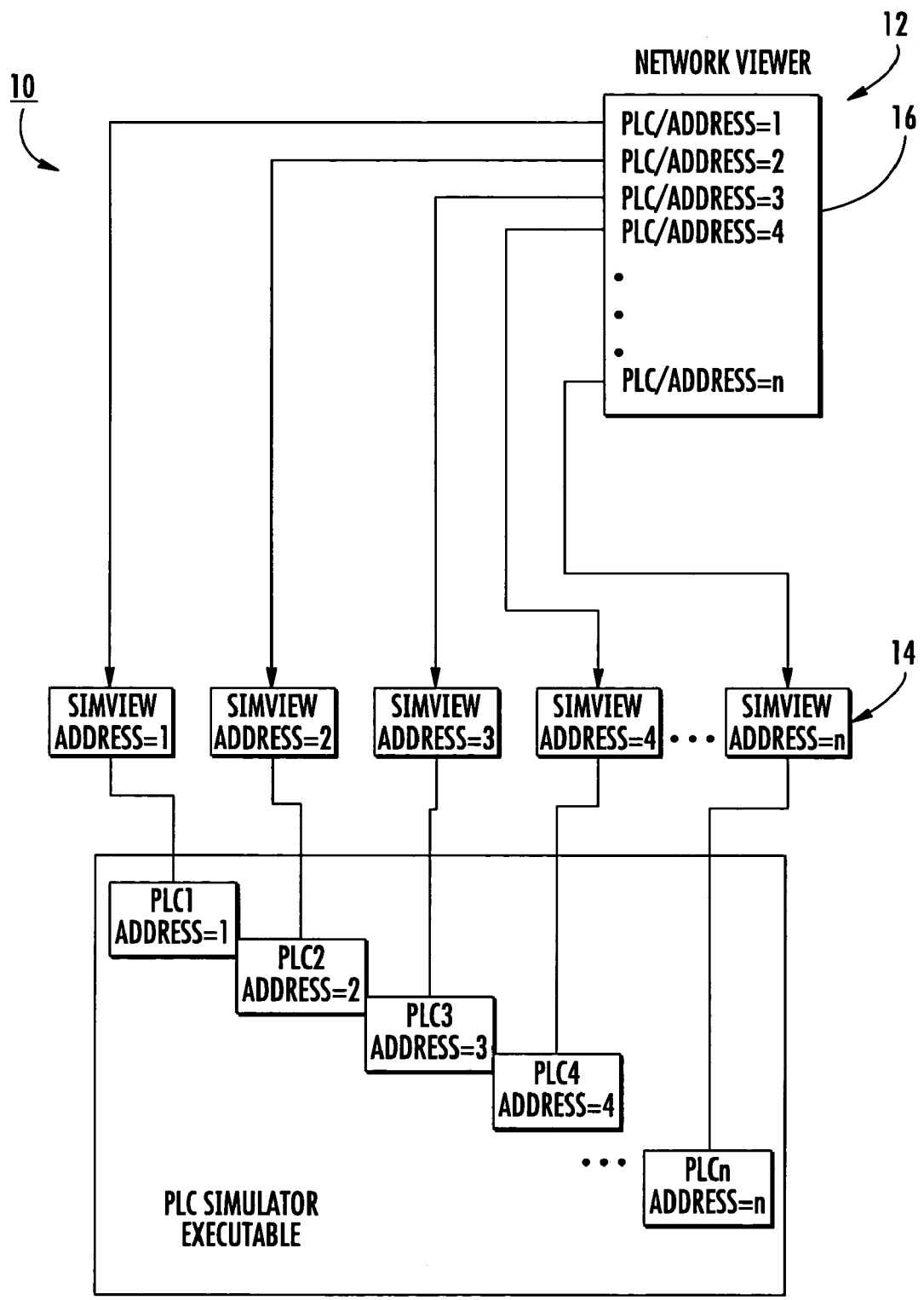
FIG. 2 shows interconnections between a network viewer and a plurality of PLCs as in FIG. 1.

With reference now to FIGS. 1 and 2, an architectural overview of a network simulation or multiple PLC simulation model, designated in general by the element number 10, broadly includes a network view or viewer 12. FIG. 2 particularly shows an embodiment of interconnections in the network simulation 10 between the network view 12 and individual CPU views 14. As shown, the network view 10 will allow a user to generate multiple PLCs 16 required for various system simulations. As will be described in greater detail below, as the user makes changes in the network view 12, appropriate error messages will be returned to the individual PLCs 16 for incorrect behavior. The skilled artisan will recognize that although all PLCs 16 are shown provided within a single application, PLCs in multiple applications also can be interconnected; therefore, the invention is not limited to the examples shown in the figures.

Figure 3:
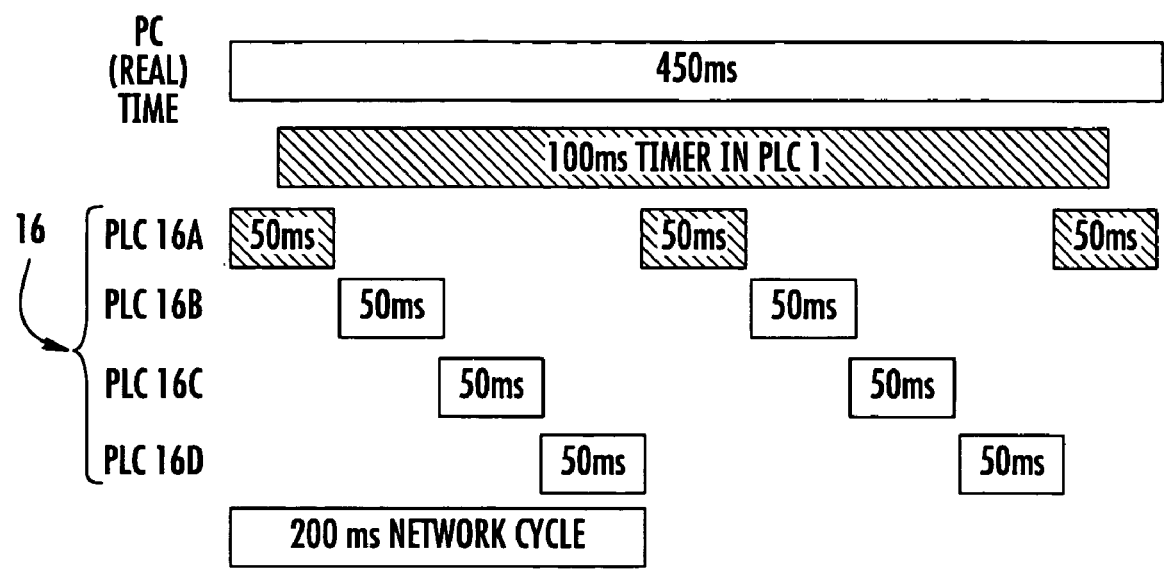
FIG. 3 is a bar chart showing time slicing according to an aspect of the present invention.

Turning to FIG. 3, timing issues are an important part of the exemplary network simulation 10 as shown in FIG. 2. Thus, the network view 12 will provide the ability to "fine tune" the performance of the network simulation 10 as well as provide ways of testing timing issues that may occur on the real network (see, e.g., step 225 in FIG. 6).

As shown in FIG. 3, the network view 12 provides establishment of "time-slicing" for multiple PLCs 16 to ensure that all of the PLCs 16 receive an equivalent amount of processing time. This is needed to simulate the PLCs 16 within the processing capabilities of a PC (not shown) and can be particularly important in larger systems.

Figure 6:
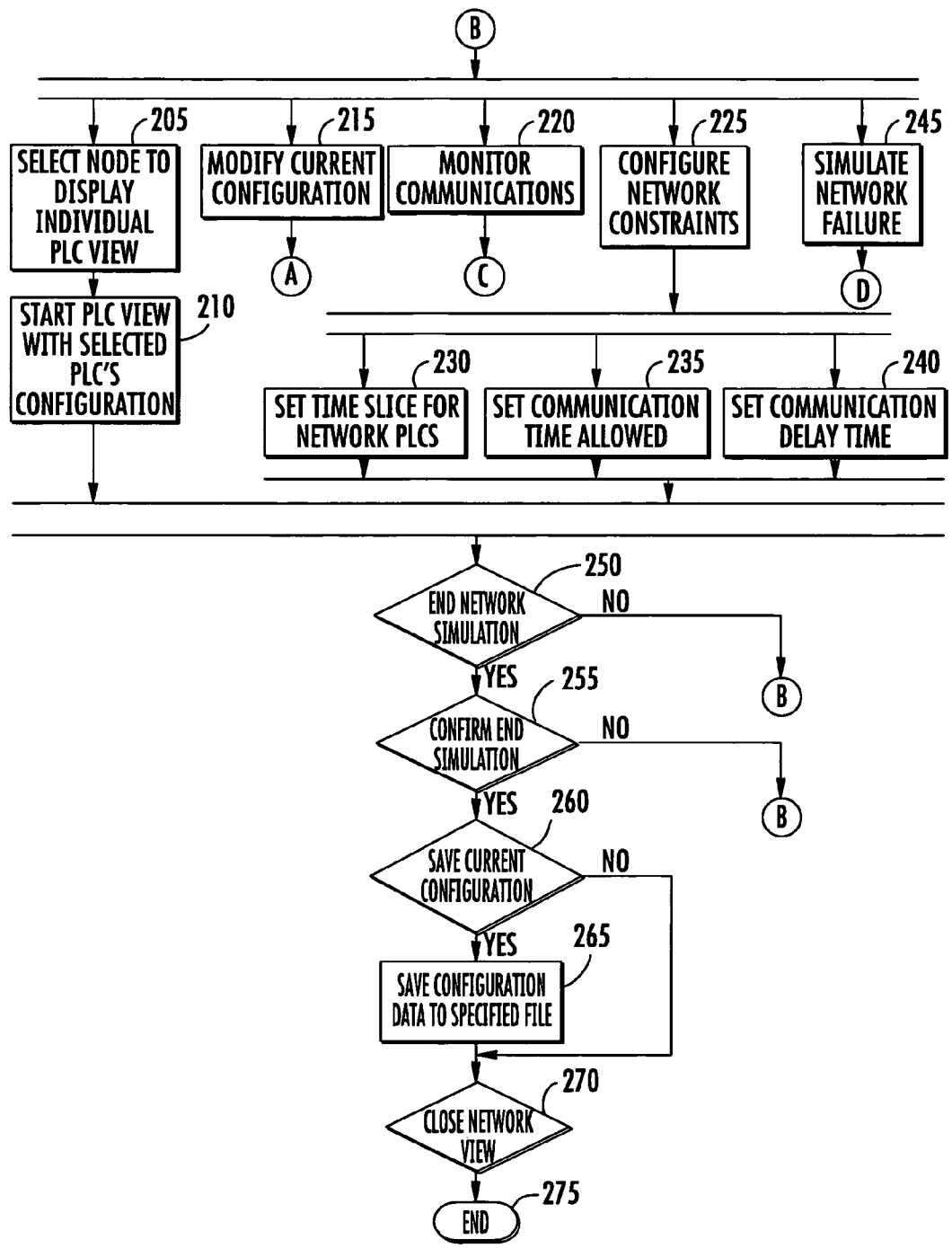
FIG. 6 is a continuation of the flowchart of FIG. 5.

More particularly, FIG. 3 shows that the network view 12 will provide an interface for an amount of time given to, for example, four PLCs 16A, 16B, 16C and 16D during a given "network cycle" time (see, e.g., step 230 in FIG. 6). As used herein, a network cycle is defined as the time that is required for all PLCs in a selected network to execute their allotted slice of time, as determined by the network view. Further, time slicing is based on simulated time, not on PC time.

FIG. 3 also shows that given multiple PLCs 16 in a system and given a 100 ms timer in PLC 16A, the timer will not expire until PLC 16A has received 100 ms of simulated time from the time that the timer was triggered. Since the timer starts at some point after the beginning of PLC 16A's time slice, three time slices will be required for the completion of the timer. In this example, the network cycle time would be 200 ms. Time slicing will be discussed further with reference to FIG. 5 below.

The invention may be better understood with reference now to exemplary methods of operation as shown in FIGS. 4-9.

Figure 4:
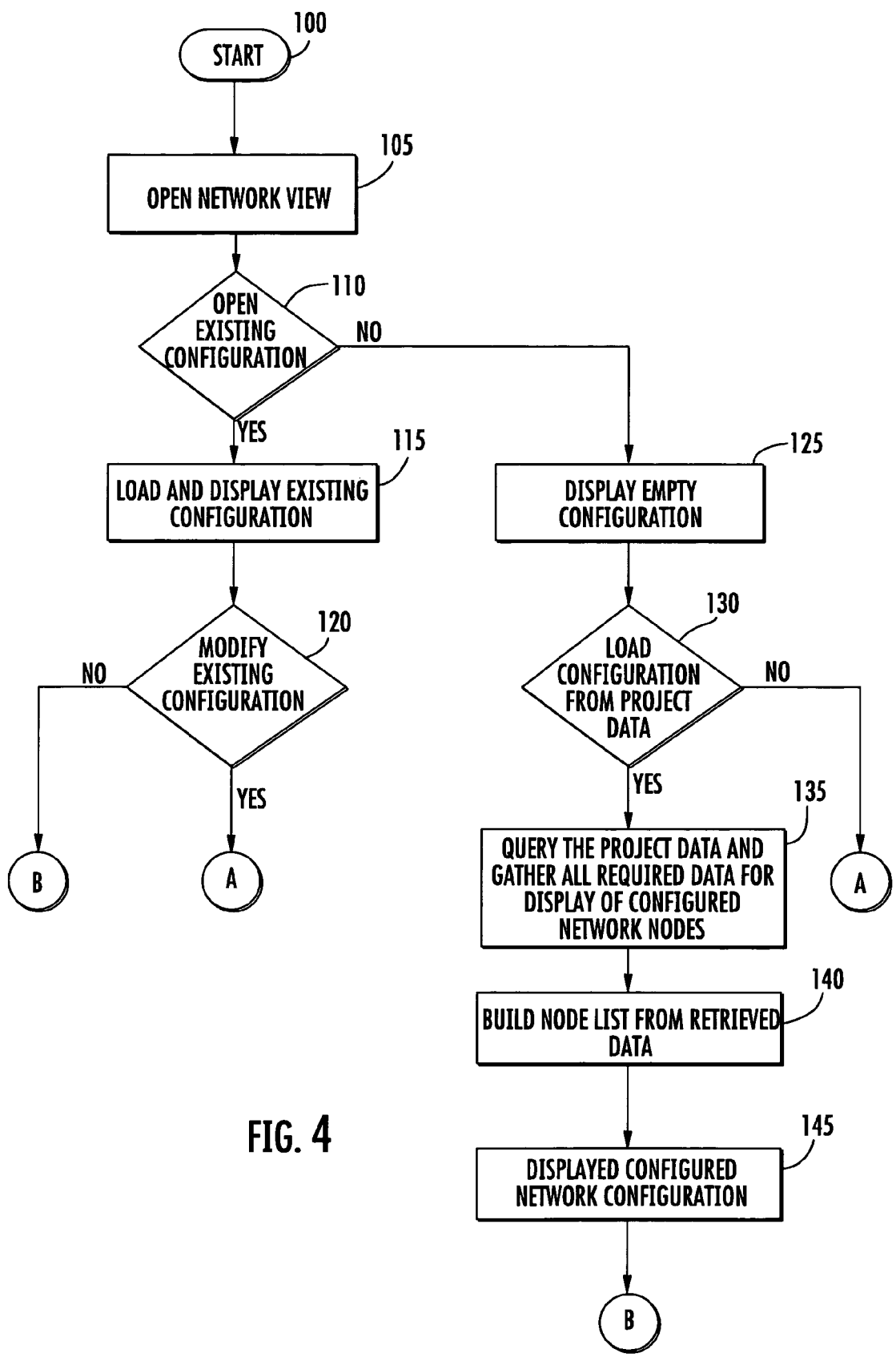
FIG. 4 shows a flowchart according to an aspect of the invention.

FIG. 4, for example, shows that the user will use a network view (100) such as the network view 10 introduced above to create multiple PLCs 16 prior to initiating the download after the network view is opened (105). As shown, the user has the choice of opening an existing configuration or creating a new network configuration (110). If an existing configuration is opened, the specified configuration will be loaded from the saved file and the current configuration (115) will be displayed. The user can then modify the configuration or begin using the configuration as it currently exists (120).

If the user chooses to create a new network configuration, an empty configuration will be displayed (125), and the user must populate this configuration with the nodes in the network. This will be accomplished by one of two methods (130). The first way involves the network view querying the programming tool for network information based on a particular project in the programming tool (135). The network view will collect all of the available information about the network including, but not limited to, the number of PLCs, the types of the PLCs, the I/O connected to the PLCs, and the type of connections for each of the PLCs (a PROFIBUS type of protocol, Ethernet, MPI, etcetera). If this approach is used, the network view will provide a selectable list of PLCs along with the pertinent information as mentioned above (140). The display of this information will be configurable (145).

Figure 5:
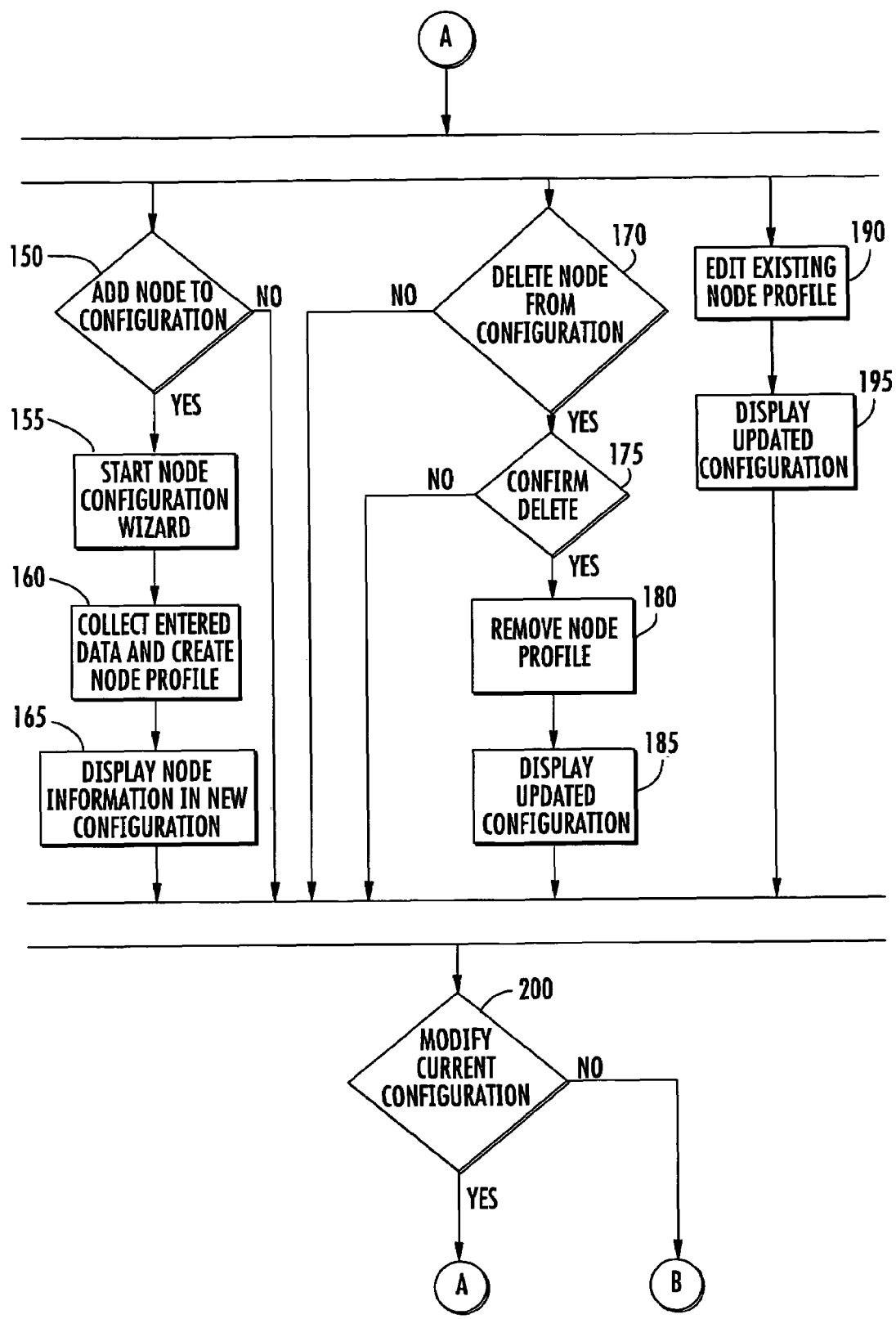
FIG. 5 is a continuation of the flowchart of FIG. 4.

If the information at the above step (140) is not available from the project data in the programming tool, or the user wishes to manually configure the network, a second method as shown in FIG. 5 will be used to populate the network with 1 to n network connections (150). As shown, the network view will provide a wizard for generating the required information for each network connection (155). The wizard will prompt the user for all pertinent information needed to define the node and its connections (160) and display the nodes and their corresponding information (165).

With reference to both FIGS. 5 and 6, regardless of the method chosen to create the configuration, the currently displayed configuration can be modified at anytime (215). Specifically, the user can add new nodes to the network (150), which will again bring up the configuration wizard (155). Again, the data will be collected (160), and the new node with its data will be displayed (165).

As further shown in FIG. 5, the user can delete existing nodes from the network (170). If a node is selected to be deleted, the user will be prompted to confirm the delete (175).

If the user confirms the deletion, the node's profile is removed from the configuration (180) and the updated configuration is displayed (185). The user can also modify the data for a selected node (190). Once the modification is complete, the updated configuration is displayed (195). As shown, the user can make as many modifications to the existing configuration as desired (200).

With more particular reference to FIG. 6, after the network connections are established, each PLC connection can be selected by the user to open a PLC view for that PLC (205). Once the PLC view is open, the user will be able to interact with the PLC view for the selected PLC (210). Each PLC view is specific to the selected PLC, but multiple PLC views may be opened concurrently, providing the opportunity for interaction with multiple PLCs. According to one aspect of the invention, PLCs can be destroyed by the network view. Each PLC will have its own PLC view, but will only be displayed if the PLC is selected from the network view. In other words, it is not necessary for all of the PLCs to have their views active at any given time. There is nothing in the system to prevent this, but it is only necessary if the user chooses to make all of the views active.

With continued reference to FIG. 6, the issue of timing allowed for communication between PLCs is handled by the network view, as introduced above with respect to FIG. 3. As discussed, timing issues can be a vital part of the network simulation. Therefore, as shown in FIG. 6, the network view will allow the user to specify the amount of time allowed for the communication between the individual PLCs on the network (235). The time increment will be outside of the network cycle time mentioned above. In other words, if a simulated system has a network cycle time of 200 ms and a communication time interval of 50 ms, network cycles will start no more often than every 250 ms. Only those communication packets that can be handled within the allotted communication time interval will occur during that specific interval. In other words, if there are more communication packets than can be handled within the allotted time, the remaining packets will be delayed until the next communication period, at which time they will be the first to be processed.

In order to test some of the specific "timing" issues between the PLCs, as further shown in FIG. 6, the network view also provides the ability to add a "delay" time into the communication interval upon demand (240), which can be implemented in the following manner. As in the example provided above, the user specifies a 50 ms communication interval. To test out error conditions during communication, the user enters 30 ms as a communication delay time. After these values are set in the network view, the user can turn the delay on and off by selecting the delay option from the network view interface. When the delay feature is activated, no communication takes place during the first 30 ms of the communication interval. During the last 20 ms, communication will behave normally with the packets that can be handled during that time being processed and the rest being postponed until the next communication interval. This process will continue until the delay feature is deactivated.

Figure 7:
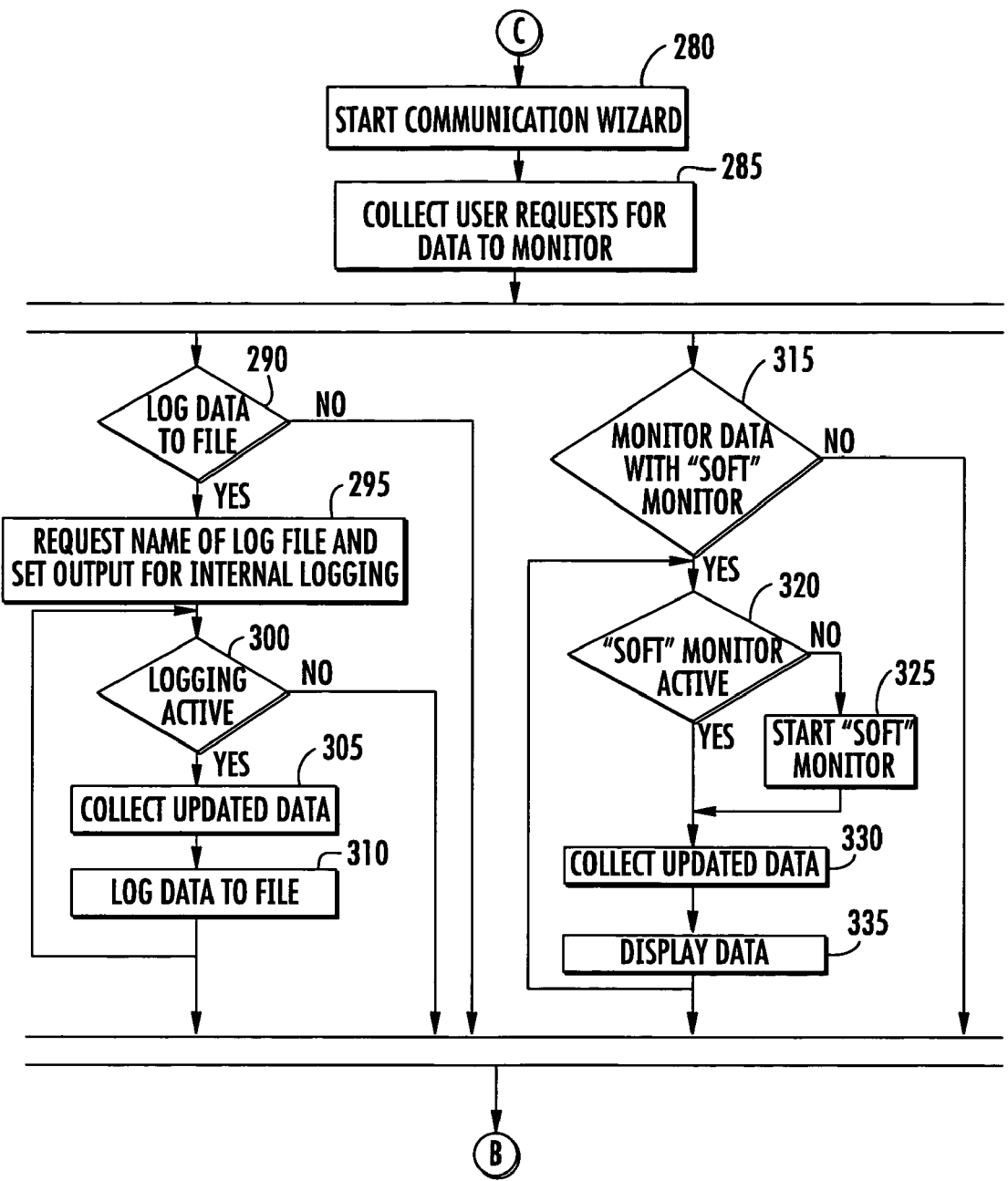
FIG. 7 is a continuation of the flowchart of FIG. 6.

With reference to FIGS. 3 and 7, in addition to providing timing manipulation features for communication between the PLCs in the simulated network, the network view will provide a communication monitor to observe and further manipulate the communication characteristics of the simulated network (220). FIG. 7 particularly shows that the network view will provide a communication trace wizard (280) to configure what communication is to be monitored and will allow the user to specify a log file for a communication dump (295).

The wizard in FIG. 7 will allow the user to customize which communication traffic that they wish to monitor (285). The user can select if the selected information is to be logged to a file (290) or displayed using a "soft" monitor (315). The selected information to be monitored will then be collected (305) and written to the specified file (310) when the tracing toggle switch is activated (300).

As shown in FIG. 7, the network view will also provide the ability to actively monitor communication traffic using a "soft" monitor. This monitor will collect (330) and display (335) of the selected data when activated through a monitoring toggle switch (320). If the toggle switch is activated, but the monitor is not currently displayed, the invention will start the monitor (325). The monitor will remain displayed, regardless of whether it is actively updating, until it is closed by the user.

All communication monitoring is configured through the communication trace interface, regardless of whether it is being logged to a file or is being actively monitored through the "soft" monitor. The interface also allows statistics such as average number of packets, average packet transmission time, number of intermediate hops between nodes, and number of cycles required for all packets within a message to be delivered. Statistics that can be gathered may include, but are not limited to the above list. This monitor and the statistics provided allow the user to determine if the communication tasks take place within the allotted time. The monitor will also allow the user to confirm the validity and integrity of point to point communications. This will be especially useful in verifying the accurate delivery of data to the HMI interfaces.

With brief reference once more to FIG. 6, the network view also allows the user to simulate a number of network system failures and stresses (245). These include, but are not limited to, single node failures, "wire" failures, "jabber" on the network, the transmission of corrupt packets, the dropping of packets, and overloading the network with communication traffic. As known in the industry, "jabber" is a term for communication that is considered "garbage communication" or noise.

Figure 8:
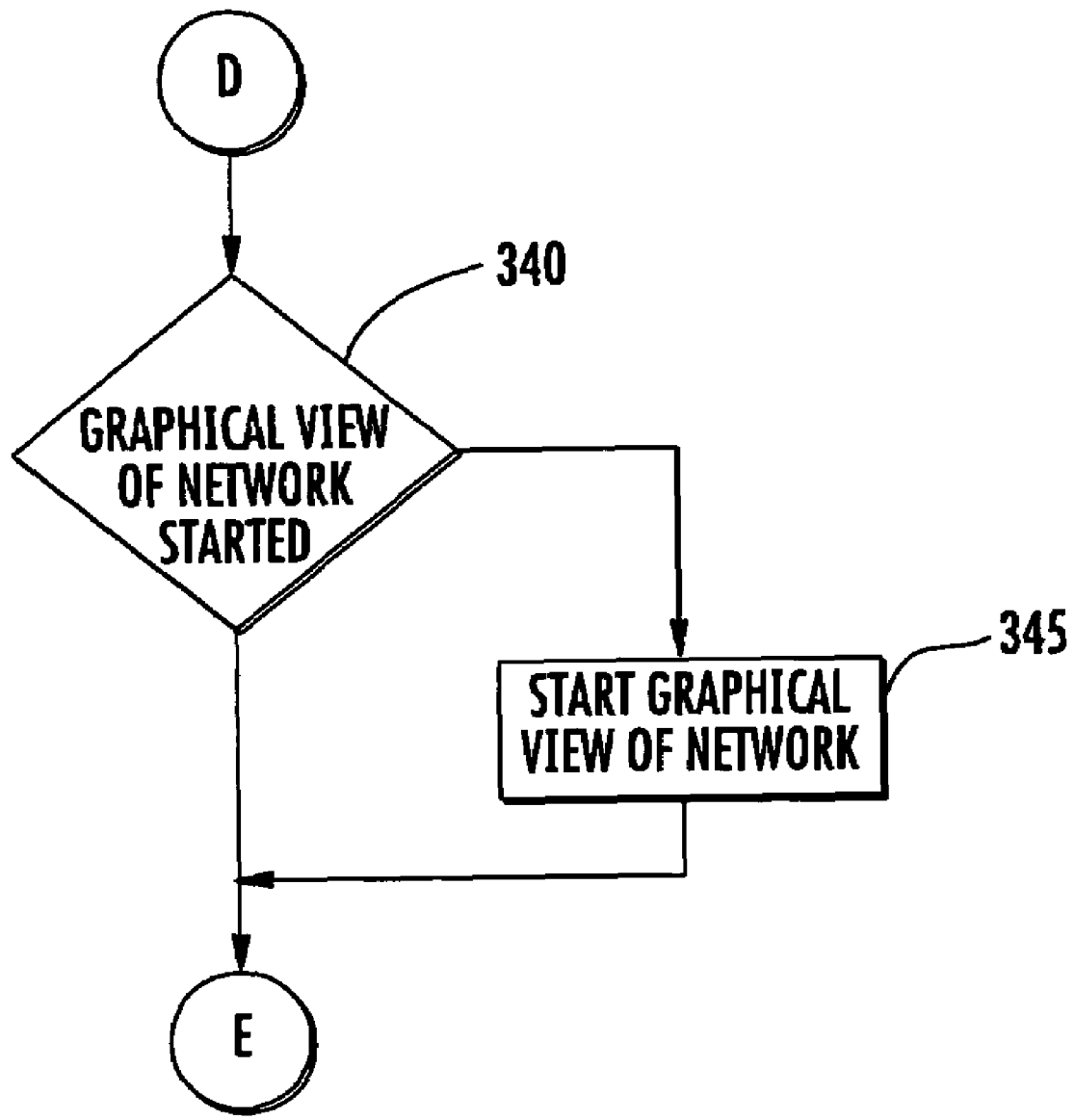
FIG. 8 is a continuation of the flowchart of FIG. 7.
Figure 9:
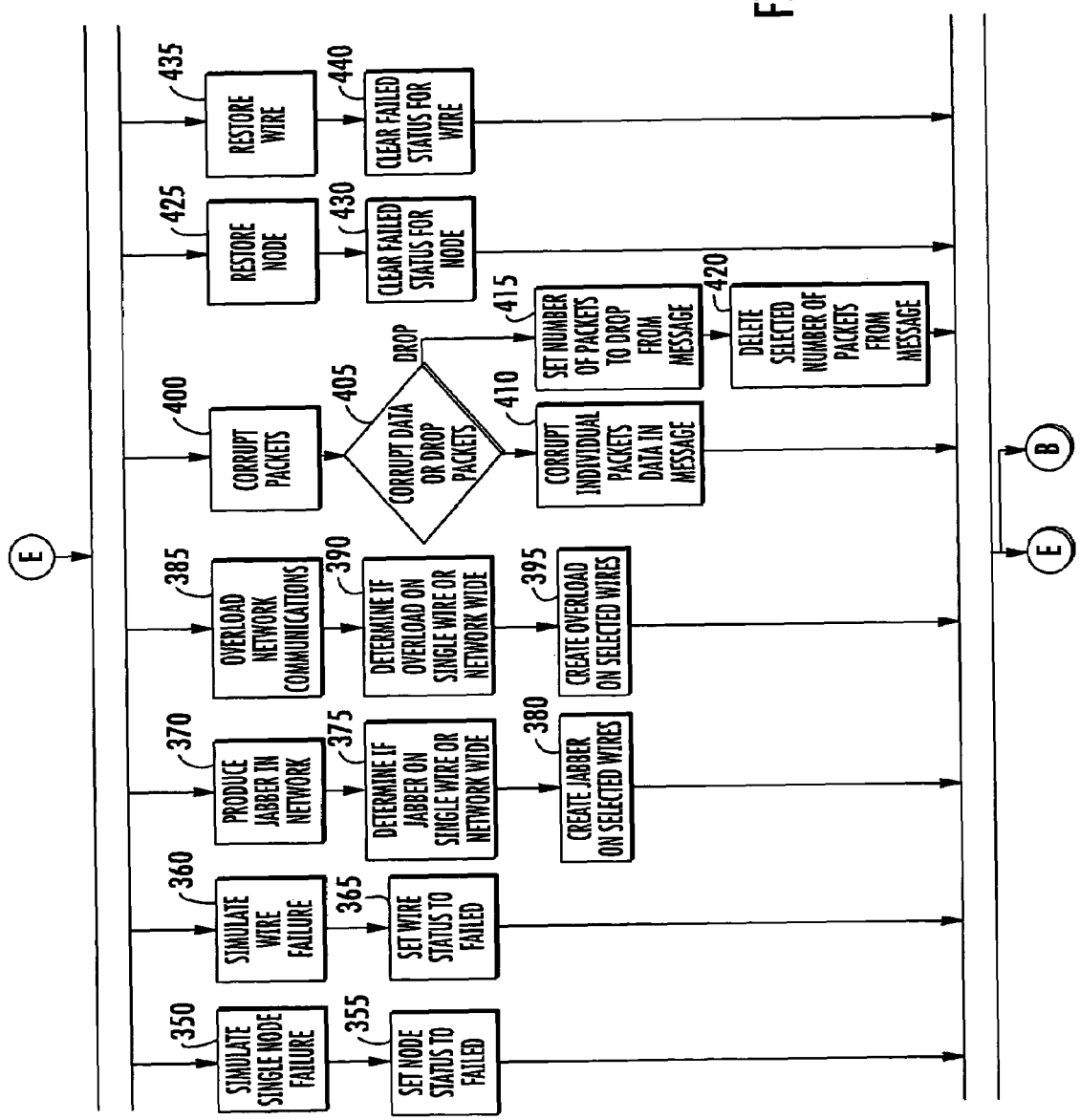
FIG. 9 is a continuation of the flowchart of FIG. 8.

Referring now to FIGS. 8 and 9, the network view will provide a graphical view of the network that contains all of the nodes on the network and their connections. If the graphical view is not started when the user wishes to simulate a network error (340), it will be started (345) to provide the interface for simulating network errors. As shown, to simulate a single node failure (350), the user simply selects a node and places it in "failed" mode (355). This is effectively the same as "pulling" the real PLC from the rack, therefore removing it from the network. The user can do this to any number of nodes in the simulated network to simulate multiple failures. The selected node(s) will remain in "failed" state until they are selected and placed in the "good" state (425). This will clear the failed status flag for the node (430).

As further shown in FIG. 9, the user can also simulate a wire failure (360) by selecting the connection or "wire" between nodes and set it to failed mode (365). When a wire is in failed mode, no communication can take place over that connection. Multiple wires can be selected to simulate multiple wire failures in the network. The selected wire(s) will remain in "failed" state until they are selected and placed in the "good" state (435). This will clear the failed status flag for the node (440). A wire or multiple wires (375) can be selected to introduce jabber into the network (370). This can be done to make sure that nodes handle the case where they receive garbage over a given connection (380). A wire or multiple wires may be selected to "corrupt" the packets passing on them (400). There are two different types of packet corruption (405). The first type of corruption occurs when the data is compromised or changed between the transmitter and the receiver (410). The invention will corrupt individual packets when this option is selected. The second type occurs when packets are lost such that an incomplete message would arrive at the receiver (415). The invention will delete the specified number of packets when this option is selected (420). The user may also select to overload a specific wire(s) or the entire network (390) to overload with data communication (385). This will stress the bandwidth communications between nodes (395). This is also useful when selecting the connection to an HMI so that the communication to the HMI device can be tested if it is heavily loaded with communication.

With brief reference again to FIG. 5, when the user is finished simulating the network, they will select close from the network view (250). They will be prompted to confirm that they wish to end the simulation (255). Once they confirm the end of the simulation, they will be prompted to save the configuration (260). If they choose to save the configuration, the invention will save the configuration to the specified file (265). After the configuration is saved, or if they choose not to save the configuration, the network view will be closed (270), thus ending the simulation (275).

While preferred embodiments of the invention have been shown and described, those skilled in the art will recognize that other changes and modifications may be made to the foregoing embodiments without departing from the scope and spirit of the invention. It is intended to claim all such changes and modifications as fall within the scope of the appended claims and their equivalents.

That which is claimed is:

1. A computer implemented method for simulating a plurality of networked program logic controllers, the method comprising:
    wherein the computer determines if a configuration of networked program logic controllers exists in a network within a simulation model;
    the computer populates a configuration within a simulation model by creating a plurality of program logic controllers in a network if the configuration does not exist, the populating of program logic controllers provided by use of a network view for collecting network information; and
    the computer interacts with at least one of the program logic controllers in the configuration of networked program logic controllers within the simulation model to simulate at least one networked program logic controller.

2. The method of claim 1, wherein the network information includes at least one selected from the number of the program logic controllers, types of the program logic controllers, I/O connected to the program logic controllers and type of connection for each of the program logic controllers.

3. The method of claim 1, wherein the network information defines at least one node associated with the networked program logic controller.

4. The method of claim 3, further comprising deleting the selected node from the network.

5. The method of claim 4, further comprising updating and displaying the configuration without the selected node.

6. The method of claim 1, wherein the network information defines, at least one node and further comprising modifying the node.

7. The method of claim 6, further comprising updating and displaying the configuration with the modified node.

8. The method of claim 1, wherein each of the networked program logic controllers has a respective program logic controller view and further comprising opening at least two of the networked program logic controller views for interaction of at least two of the networked program logic controllers.

9. The method of claim 1, further comprising returning an error message to the networked program logic controller to correct an improper response by the networked program logic controller.

10. The method of claim 1, further comprising assessing a number of program logic controllers in the network, determining a network cycle time and allotting respective processing times to each of the program logic controllers in the network based on the network cycle time.

11. The method of claim 10, further comprising adding a delay time to at least one of the processing times.

12. The method of claim 1, wherein the network information defines' at least one node associated with the networked program logic controller.

13. The method of claim 12, further comprising deleting the selected node from the network.

14. The method of claim 12, further comprising updating and displaying the configuration without the selected node.

15. The method of claim 1, further comprising assessing a number of program logic controllers in the network, determining a network cycle time and allotting respective processing times to each of the program logic controllers in the network based on the network cycle time.

16. A computer implemented method for simulating a plurality of networked program logic controllers, the method comprising:
    wherein the computer determines if a configuration of networked program logic controllers exists in a network within a simulation model;
    the computer populates a configuration within a simulation model by creating a plurality of program logic controllers in a network if the configuration does not exist, the populating of program logic controllers provided by use of a wizard in a network view for entry by a user of network information; and
    the computer interacts with at least one of the program logic controllers in the configuration of networked program logic controllers within the simulation model to simulate a networked program logic controller.

17. The method of claim 16, wherein the network information includes at least one selected from the number of the program logic controllers, types of the program logic controllers, I/O connected to the program logic controllers and type of connection for each of the program logic controllers.

18. The method of claim 16, wherein the network information defines at least one node and further comprising modifying the node.

19. The method of claim 18, further comprising updating and displaying the configuration with the modified node.

20. The method of claim 16, wherein each of the networked program logic controllers has a respective program logic controller view and further comprising opening at least two of the networked program logic controller views for interaction of at least two of the networked program logic controllers.

21. A computer implemented method for simulating a plurality of networked program logic controllers, the method comprising:
    wherein the computer determines if a configuration of networked program logic controllers exists in a network within a simulation model;

the computer populates a configuration within a simulation model by creating a plurality of program logic controllers in a network if the configuration does not exist, the populating of program logic controllers provided by use means for collecting network information; and the computer interacts with at least one of the program logic controllers in the configuration of networked program logic controllers within the simulation model to simulate at least one networked program logic controller.

22. The method of claim 21, wherein the means for collecting is one of a network view or a wizard in a network view.

* * * * *